(12) United States Patent
Goto

(10) Patent No.: US 6,362,623 B1
(45) Date of Patent: Mar. 26, 2002

(54) GRADIENT COIL FOR MRI APPARATUS USING SHIELDING COIL DISPOSED IN A HIGH WINDING DENSITY ZONE

(75) Inventor: Takao Goto, Tokyo (JP)

(73) Assignee: GE Yokogawa Medical Systems, Limited, Tokyo (JP)

( * ) Notice: Subject to any disclaimer, the term of this patent is extended or adjusted under 35 U.S.C. 154(b) by 0 days.

(21) Appl. No.: 09/546,222

(22) Filed: Apr. 10, 2000

(30) Foreign Application Priority Data

Jun. 18, 1999 (JP) .......................................... 11-172368

(51) Int. Cl.[7] ................................................ G01V 3/00
(52) U.S. Cl. ........................ 324/318; 324/320; 324/319
(58) Field of Search ................................. 324/318, 319, 324/320

(56) References Cited

U.S. PATENT DOCUMENTS 4,644,313 A * 2/1987 Miyajima .................... 324/318

* cited by examiner

Primary Examiner—Hezron Williams
Assistant Examiner—Dixomara Vargas
(74) Attorney, Agent, or Firm—Moonray Kojima

(57) ABSTRACT

In order to reduce the electric current loss and the heat release in a shielding coil, partially shielding coils 1Zts and 1Zbs are employed having their windings positioned corresponding only to a high winding density zone 1Zp, rather than corresponding to the entire winding area, of main gradient coils 1Zt and 1Zb.

12 Claims, 8 Drawing Sheets

GRADIENT COIL FOR MRI APPARATUS USING SHIELDING COIL DISPOSED IN A HIGH WINDING DENSITY ZONE

BACKGROUND OF THE INVENTION

The present invention relates to a gradient coil for an MRI (magnetic resonance imaging) apparatus, a method of manufacturing a gradient coil for an MRI apparatus, and an MRI apparatus, and more particularly to a gradient coil for an MRI apparatus having a low electric power loss and a low heat release in its shielding coil, a method of manufacturing such a gradient coil, and an MRI apparatus.

FIG. 11 illustrates an exemplary magnet assembly in a conventional MRI apparatus.

The magnet assembly 51 comprises yokes 20, a pair of opposing permanent magnets 1Mt and 1Mb attached to the yokes 20 for generating a static magnetic field, magnetic field conditioning plates 24 and 25 disposed on the opposing surfaces of the permanent magnets 1Mt and 1Mb, respectively, for improving homogeneity of the static magnetic field, upper and lower Z-axis main gradient coils 1Zt and 1Zb disposed on the opposing surfaces of the magnetic field conditioning plates 24 and 25, respectively, for generating a Z-axis gradient magnetic field, an upper Z-axis shielding coil 51Zts for preventing magnetic flux generated by the upper Z-axis main gradient coil 1Zt from affecting the magnetic field conditioning plate 24, and a lower Z-axis shielding coil 51Zbs for preventing magnetic flux generated by the lower Z-axis main gradient coil 1Zb from affecting the magnetic field conditioning plate 25.

A combination of the upper Z-axis shielding coil 51Zts, the upper Z-axis main gradient coil 1Zt, the lower Z-axis main gradient coil 1Zb and the lower Z-axis shielding coil 51Zbs constitutes a Z-axis gradient coil 51Z.

Although omitted in the drawings, X- and Y-axis gradient coils are also disposed on the opposing surfaces of the magnetic field conditioning plates 24 and 25.

FIG. 12 is a schematic perspective view of the Z-axis gradient coil 51Z.

Windings of the upper Z-axis shielding coil 51Zts are disposed corresponding to the entire winding area of the upper Z-axis main gradient coil 1Zt. However, the number of the windings of the upper Z-axis shielding coil 51Zts is less than that of the upper Z-axis main gradient coil 1Zt.

Although the number of windings of the conventional Z-axis shielding coils 51Zts and 51Zbs is less than that of the Z-axis main gradient coils 1Zt and 1Zb, it is significantly large because the windings of the Z-axis shielding coils 51Zts and 51Zbs are positioned corresponding to the entire winding area of the Z-axis main gradient coils 1Zt and 1Zb. Thus, the Z-axis shielding coils 51Zts and 51Zbs have a large electric power loss.

Specifically, the conventional gradient coil for the MRI apparatus gives rise to a problem of generating a large electric power loss, and hence a large heat release in its shielding coil.

SUMMARY OF THE INVENTION

It is an object of the present invention to provide a gradient coil for an MRI apparatus having a low electric power loss and a low heat release in its shielding coil, a method of manufacturing such a gradient coil, and an MRI apparatus.

In accordance with a first aspect of the present invention, there is provided a gradient coil for an MRI apparatus comprising a partially shielding coil interposed between a main gradient coil and a magnetic component, the partially shielding coil having its windings positioned only in a high winding density zone containing a portion in which a winding density of the main gradient coil is highest.

In the gradient coil for an MRI apparatus of the first aspect, the windings of the shielding coil are positioned corresponding only to a high winding density zone, rather than corresponding to the entire winding area, of the main gradient coil. (For this reason, the coil is called a "partially shielding coil".) Accordingly, the number of the windings can be reduced, thereby reducing the electric power loss and the heat release. In addition, since the shielding performance required can still be attained, magnetic flux generated by the main gradient coil can be prevented from affecting a magnetic component (such as a magnetic field conditioning plate), thereby avoiding an adverse effect of remanence in the magnetic component.

In accordance with a second aspect of the invention, there is provided a method of manufacturing a gradient coil for an MRI apparatus, comprising the steps of applying an image electric current method only to a high winding density zone containing a portion in which a winding density of a main gradient coil is highest and applying a boundary condition only to the same zone to determine the position of windings of a partially shielding coil having its windings positioned only in the high winding density zone.

In the method of manufacturing a gradient coil for an MRI apparatus of the second aspect, the image electric current method is applied only to a high winding density zone and the boundary condition is applied only to the same zone, rather than to the entire winding area of the main gradient coil. Accordingly, the windings of the shielding coil can be suitably positioned corresponding only to the high winding density zone. (For this reason, the coil is called a "partially shielding coil".)

In accordance with a third aspect of the invention, there is provided a method of manufacturing a gradient coil for an MRI apparatus, comprising the steps of defining an optimization plane between a partially shielding coil and a magnetic component lying near the partially shielding coil, the partially shielding coil having its windings positioned only in a high winding density zone containing a portion in which a winding density of a main gradient coil is highest, and optimizing the position of the windings of the partially shielding coil by a least squares technique so that a magnetic field is minimized within the optimization plane.

In the method of manufacturing a gradient coil for an MRI apparatus of the third aspect, the windings of the shielding coil are positioned only in a high winding density zone, rather than over the entire winding area, of the main gradient coil, and the position of the windings is optimized by a least squares technique. Accordingly, the windings of the shielding coil can be suitably positioned corresponding only to the high winding density zone. (For this reason, the coil is called a "partially shielding coil".)

In accordance with a fourth aspect of the invention, there is provided a method of manufacturing a gradient coil for an MRI apparatus, comprising the steps of applying an image electric current method only to a high winding density zone containing a portion in which a winding density of a main gradient coil is highest and applying a boundary condition only to the same zone to determine the position of windings of a partially shielding coil having its windings positioned only in the high winding density zone, and then defining an optimization plane between the partially shielding coil and a magnetic component lying near the partially shielding coil, and optimizing the position of the windings of the partially shielding coil by a least squares technique so that a magnetic field is minimized within the optimization plane.

In the method of manufacturing a gradient coil for an MRI apparatus of the fourth aspect, the image electric current method is applied only to a high winding density zone and the boundary condition is applied only to the same zone, rather than to the entire winding area of the main gradient coil. Accordingly, the windings of the shielding coil can be suitably positioned corresponding only to the high winding density zone. (For this reason, the coil is called a "partially shielding coil".) Moreover, the position of the windings of the partially shielding coil is optimized by a least squares technique. Accordingly, the windings of the shielding coil can be more suitably positioned.

In accordance with a fifth aspect of the invention, there is provided an MRI apparatus comprising a gradient coil including a main gradient coil, and a partially shielding coil having its windings positioned only in a high winding density zone containing a portion in which a winding density of the main gradient coil is highest.

In the MRI apparatus of the fifth aspect, the windings of the shielding coil are positioned corresponding only to a high winding density zone, rather than corresponding to the entire winding area of the main gradient coil. (For this reason, the coil is called a "partially shielding coil".) Accordingly, the number of windings of the shielding coil can be reduced, thereby reducing the electric power loss and the heat release. In addition, since the shielding performance required can still be attained, magnetic flux generated by the main gradient coil can be prevented from affecting a magnetic component (such as a magnetic field conditioning plate), thereby avoiding image quality degradation due to an adverse effect of remanence in the magnetic component.

Thus, according to the gradient coil for an MRI apparatus, the method of manufacturing a gradient coil for an MRI apparatus and the MRI apparatus of the present invention, the number of windings of the shielding coil can be reduced, thereby reducing the electric power loss and the heat release. In addition, since the shielding performance required can still be attained, magnetic flux generated by the main gradient coil can be prevented from affecting a magnetic component, thereby avoiding image quality degradation due to an adverse effect of remanence in the magnetic component.

Further objects and advantages of the present invention will be apparent from the following description of the preferred embodiments of the invention as illustrated in the accompanying drawings.

DETAILED DESCRIPTION OF THE INVENTION

The present invention will now be described in more detail with reference to the several embodiments thereof shown in the accompanying drawings.

Figure 1:
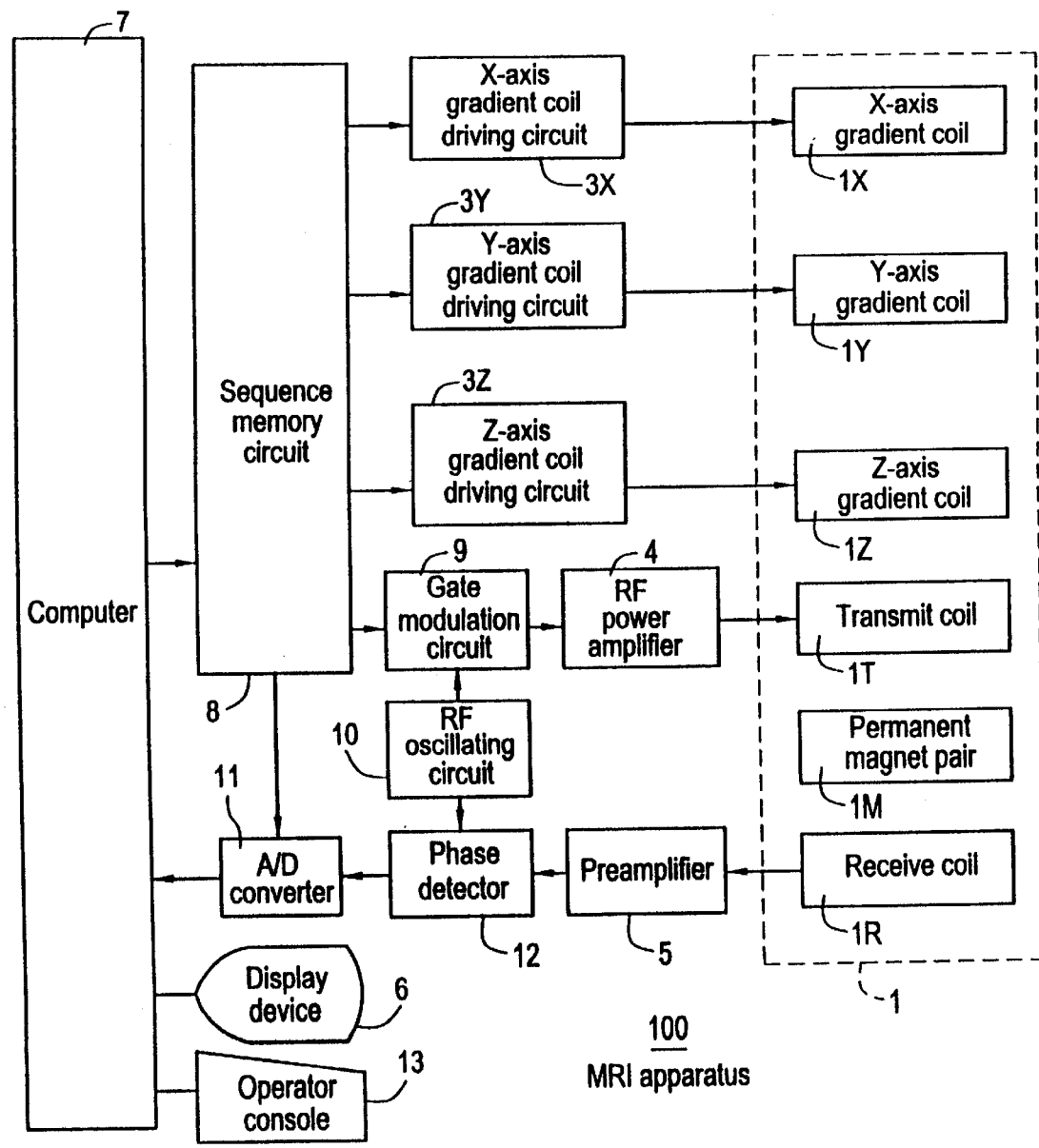
FIG. 1 is a configuration block diagram showing an MRI apparatus in accordance with an embodiment of the present invention.

FIG. 1 is a configuration block diagram showing an MRI apparatus in accordance with an embodiment of the present invention.

In the MRI apparatus 100, a magnet assembly 1 has therein a bore (vacant portion) into which a subject is inserted, and surrounding the bore, the magnet assembly 1 comprises an X-axis gradient coil 1X for generating an X-axis gradient magnetic field, a Y-axis gradient coil 1Y for generating a Y-axis gradient magnetic field, a Z-axis gradient coil 1Z for generating a Z-axis gradient magnetic field, a transmit coil 1T for applying RF pulses to gexcite spins of atomic nuclei within the subject, a receive coil 1R for detecting NMR signals from the subject, and a permanent magnet pair 1M for generating a static magnetic field.

It should be noted that a superconductive magnet may be used instead of the permanent magnet pair 1M.

The X-axis gradient coil 1X is connected to an X-axis gradient coil driving circuit 3X. The Y-axis gradient coil 1Y is connected to a Y-axis gradient coil driving circuit 3Y. The Z-axis gradient coil 1Z is connected to a Z-axis gradient coil driving circuit 3Z. The transmit coil 1T is connected to an RF power amplifier 4. The receive coil 1R is connected to a preamplifier 5.

A sequence memory circuit 8 operates the X-, Y- and Z-gradient coil driving circuits 3X, 3Y and 3Z according to instructions from a computer 7 based on a pulse sequence of a spin-echo technique or the like, to generate an X-axis gradient magnetic field, Y-axis gradient magnetic field and Z-axis gradient magnetic field from the X-, Y- and Z-axis gradient coils 1X, 1Y and 1Z, respectively. The sequence memory circuit 8 also operates a gate modulation circuit 9 to modulate a high frequency output signal from an RF oscillating circuit 10 into a pulsed signal having a predetermined timing and a predetermined envelope, and applies the pulsed signal to the RF power amplifier 4 as an excitation pulse. After power-amplified in the RF power amplifier 4, the signal is applied to the transmit coil 1T in the magnet assembly 1 to selectively excite a desired slice region.

The preamplifier 5 amplifies an NMR signal from the subject detected by the receive coil 1R in the magnet assembly 1, and inputs the signal into a phase detector 12. The phase detector 12 phase-detects the NMR signal from the preamplifier 5 with the output from the RF oscillating circuit 10 as a reference signal, and supplies the phase-detected signal to an AND converter 11. The A/D converter 11 converts the phase-detected analog signal to digital MR signal data, and inputs it to the computer 7.

The computer 7 performs an image reconstruction calculation on the MR data to produce an image of the desired slice region. The image is displayed on a display device 6. The computer 7 is also responsible for overall control such as accepting information input from an operator console 13.

Figure 2:
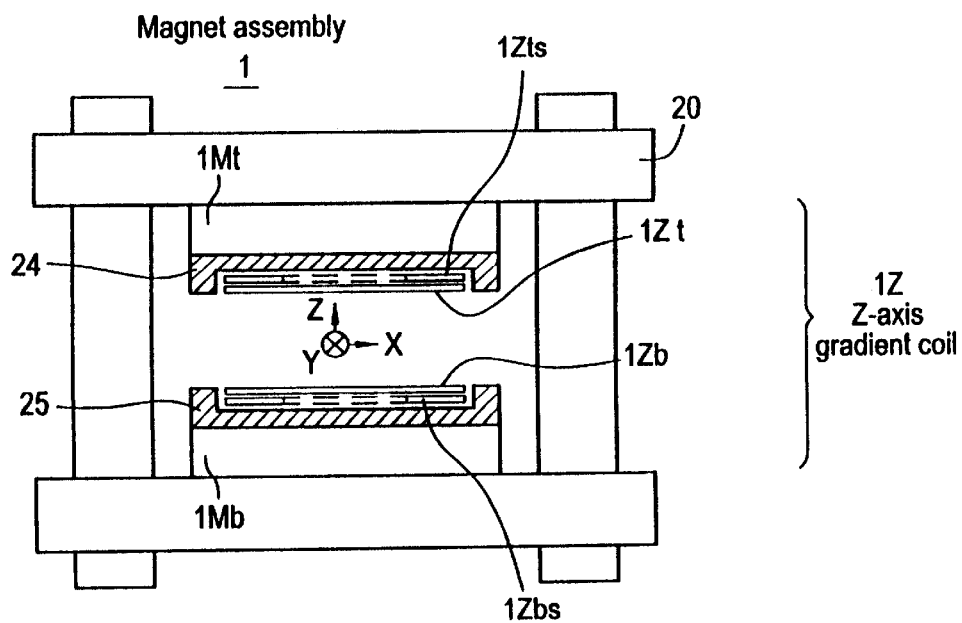
FIG. 2 is a schematic view showing the main portion of a magnet assembly in the MRI apparatus of FIG. 1.

FIG. 2 is a schematic view illustrating the main portion (which relates to the present invention) of the magnet assembly 1.

The magnet assembly 1 comprises yokes 20, a pair of opposing permanent magnets 1Mt and 1Mb attached to the yokes 20 for generating a static magnetic field, magnetic field conditioning plates 24 and 25 disposed on the opposing surfaces of the permanent magnets 1Mt and 1Mb, respectively, for improving homogeneity of the static magnetic field, upper and lower Z-axis main gradient coils 1Zt and 1Zb disposed on the opposing surfaces of the magnetic field conditioning plates 24 and 25, respectively, for generating a Z-axis gradient magnetic field, an upper Z-axis partially shielding coil 1Zts for preventing magnetic flux generated by the upper Z-axis main gradient coil 1Zt from affecting the magnetic field conditioning plate 24, and a lower Z-axis partially shielding coil 1Zbs for preventing magnetic flux generated by the lower Z-axis main gradient coil 1Zb from affecting the magnetic field conditioning plate 25.

A combination of the upper Z-axis partially shielding coil 1Zts, the upper Z-axis main gradient coil 1Zt, the lower Z-axis main gradient coil 1Zb and the lower Z-axis partially shielding coil 1Zbs constitutes a Z-axis gradient coil 1Z.

Although omitted in the drawings, the X- and Y-axis gradient coils 1X and 1Y are also disposed on the opposing surfaces of the magnetic field conditioning plates 24 and 25.

Figure 3:
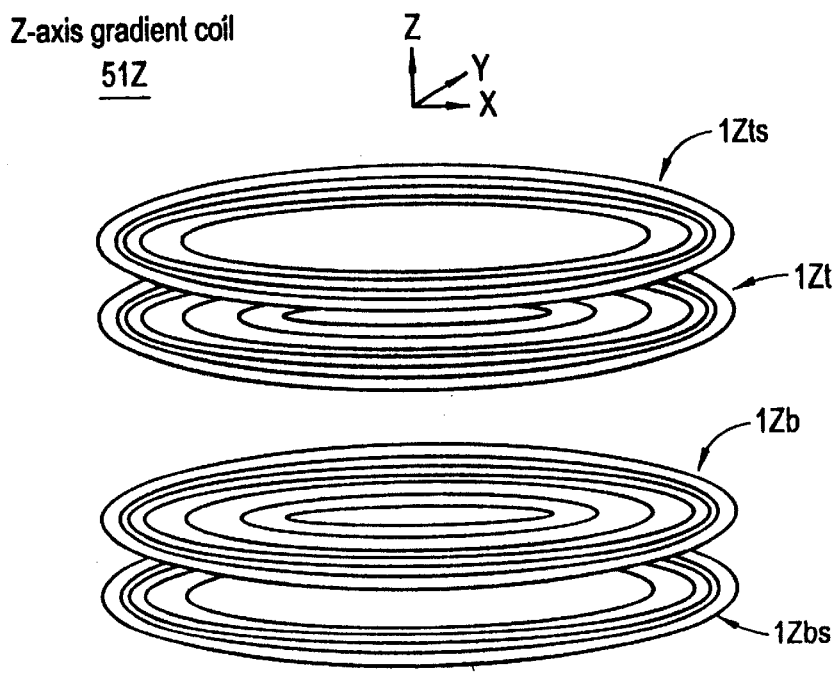
FIG. 3 is a schematic perspective view of a Z-axis gradient coil.

FIG. 3 is a schematic perspective view of the Z-axis gradient coil 1Z.

The windings of the upper Z-axis partially shielding coil 1Zts are positioned only in a high winding density zone (designated as 1Zp in FIG. 4) containing a portion in which a winding density of the upper Z-axis main gradient coil 1Zt is highest, rather than positioned corresponding to the entire winding area of the upper Z-axis main gradient coil 1Zt.

Figure 4:
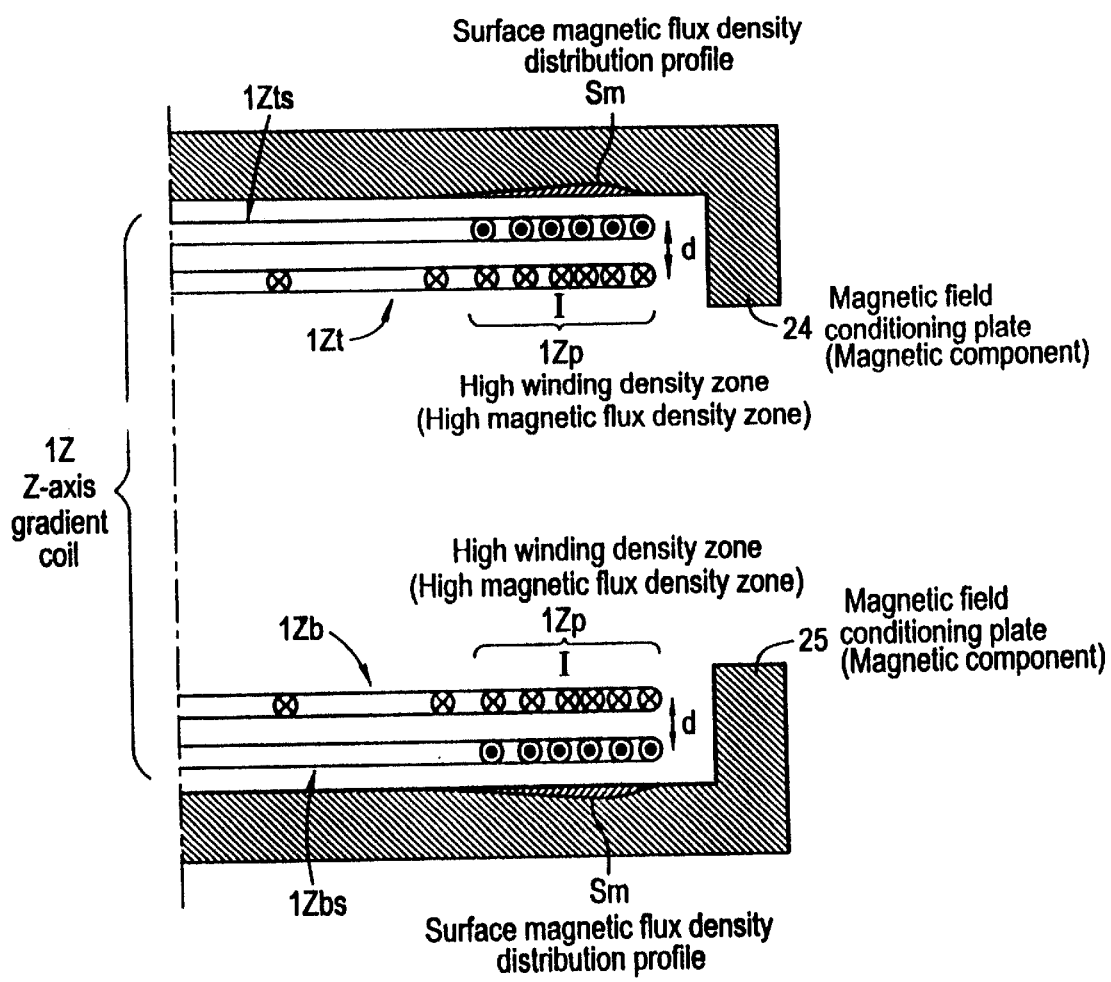
FIG. 4 is a schematic cross-sectional view of the Z-axis gradient coil.

FIG. 4 is a schematic cross-sectional view of the Z-axis gradient coil 1Z.

Figure 7:
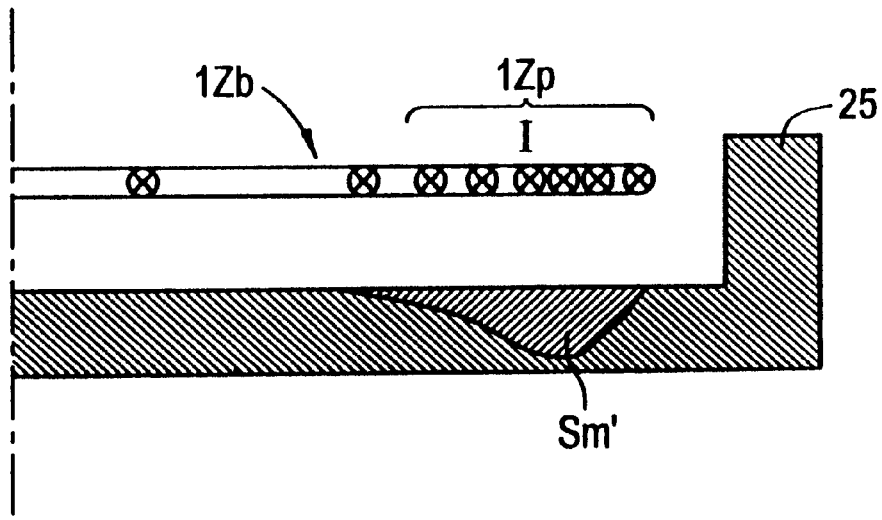
FIG. 7 illustrates the step of determining a high winding density zone from a surface magnetic flux density distribution by the main gradient coil in the absence of the partially shielding coil.

A surface magnetic flux density distribution profile Sm represents the distribution of magnetic flux density on the surface of each of the magnetic field conditioning plates 24 and 25. Another surface magnetic flux density distribution profile Sm' is shown in FIG. 7 in the absence of the Z-axis partially shielding coils 1Zts and 1Zbs. As can be seen by comparing these profiles, the magnetic flux density is suppressed on the surfaces of the magnetic field conditioning plates 24 and 25 by the presence of the Z-axis partially shielding coils 1Zts and 1Zbs. Thus, an adverse effect of remanence in the magnetic field conditioning plates 24 and 25 can be avoided.

Figure 5:
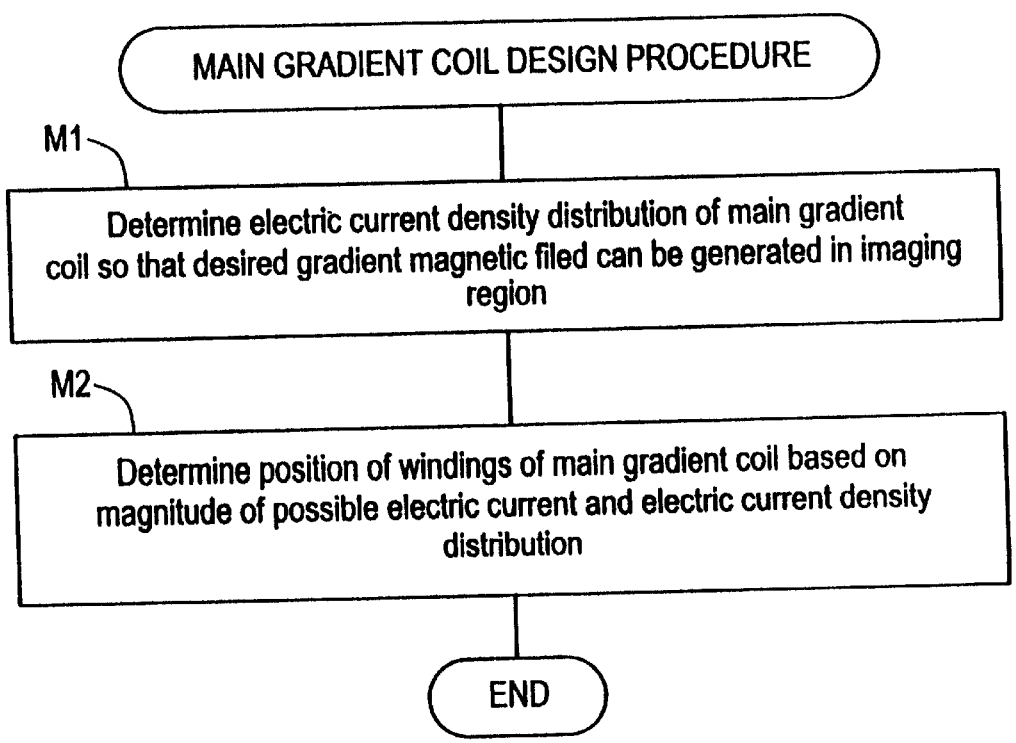
FIG. 5 is a flow chart showing a procedure of designing a main gradient coil.

FIG. 5 is a flow chart showing a procedure of designing a main gradient coil for manufacturing the main gradient coils 1Zt and 1Zb.

In Step M1, an electric current density distribution of the main gradient coil is determined so that a desired gradient magnetic field can be generated in an imaging region.

In Step M2, the position of the windings of the main gradient coil is determined based on the magnitude of electric current which the main gradient coil can carry and the electric current density distribution obtained at Step M1.

It should be noted that the procedure of designing a main gradient coil as above is basically disclosed in, for example, Japanese Patent Application Laid Open No. 6-14900.

Figure 6:
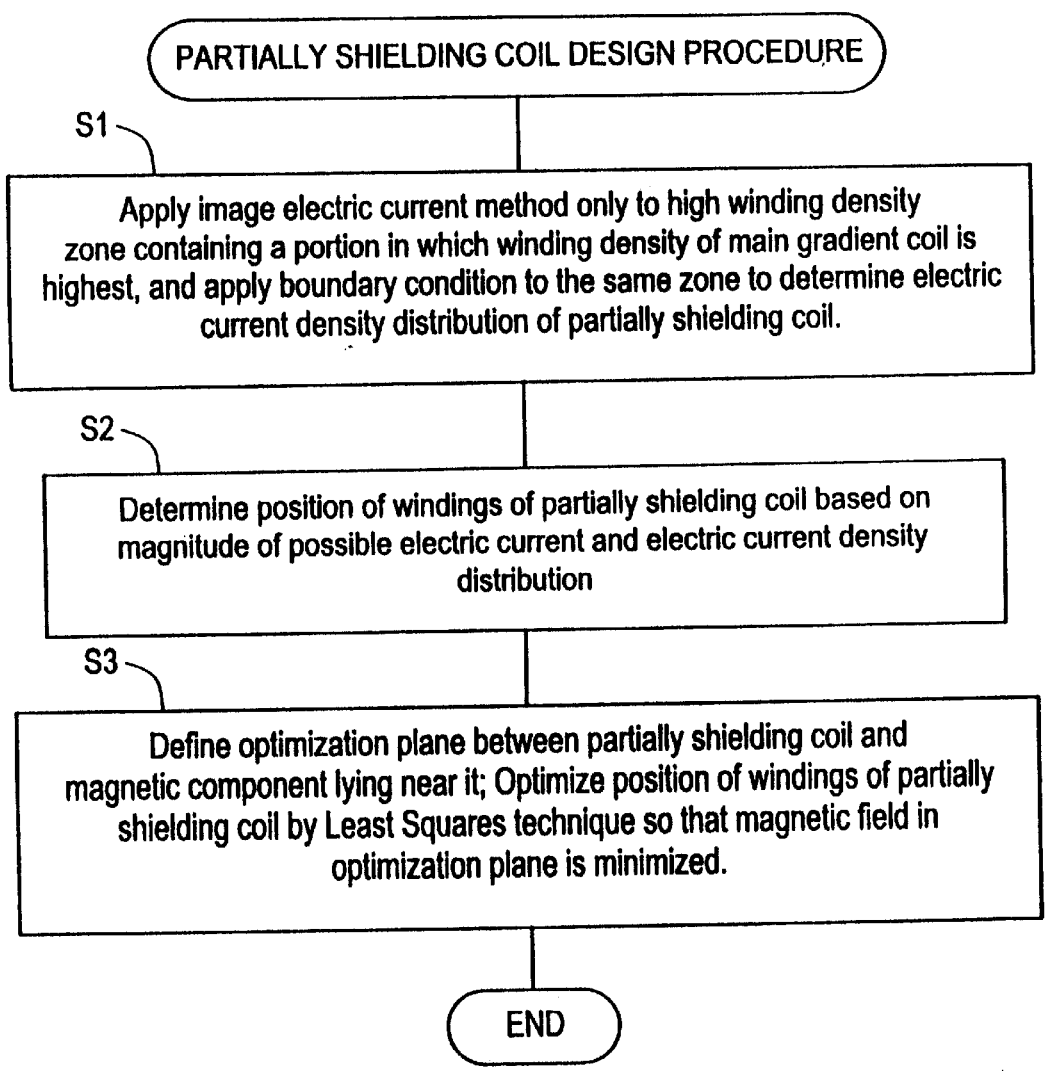
FIG. 6 is a flow chart showing a procedure of designing a partially shielding coil.

FIG. 6 is a flow chart showing a procedure of designing a partially shielding coil for manufacturing the Z-axis partially shielding coils 1Zts and 1Zbs.

Figure 8:
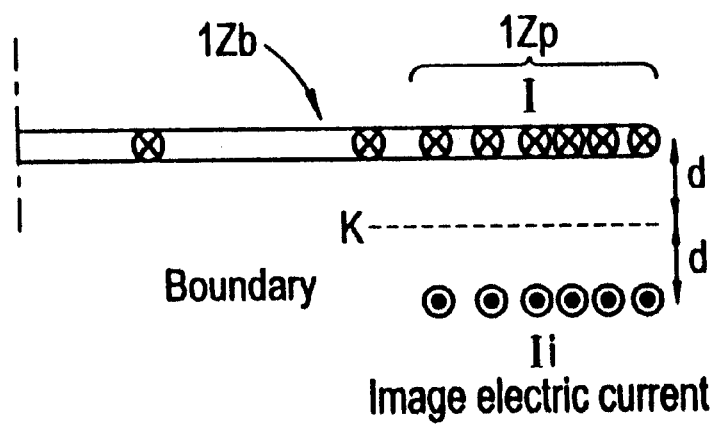
FIG. 8 illustrates the step of finding an electric current density distribution by applying an image electric current method and a boundary condition only to the high winding density zone.

In Step S1, the surface magnetic flux density distribution profile Sm' is calculated when gradient electric current I flows through the main gradient coil 1Zb in the absence of the Z-axis partially shielding coil 1Zbs, as shown in FIG. 7. A zone having a magnetic flux density of greater than 30%, for example, of the peak of the surface magnetic flux density distribution profile Sm' is then defined as a high winding density zone 1Zp. For this reason, the high winding density zone 1Zp can also be called a high magnetic flux density zone. Next, an electric current density distribution of the partially shielding coil is determined by applying an image electric current method only to the high winding density zone 1Zp, and applying a boundary condition only to the same zone, as shown in FIG. 8. Particularly, a boundary K is assumed at the height of the partially shielding coil, and image electric current Ii flowing in the direction opposite to gradient electric current I is assumed at a mirror position of the gradient electric current I with respect to the boundary K. Then, a magnetic field distribution is calculated at the boundary K, and the resulting magnetic field distribution is employed as an electric current density distribution.

Figure 9:
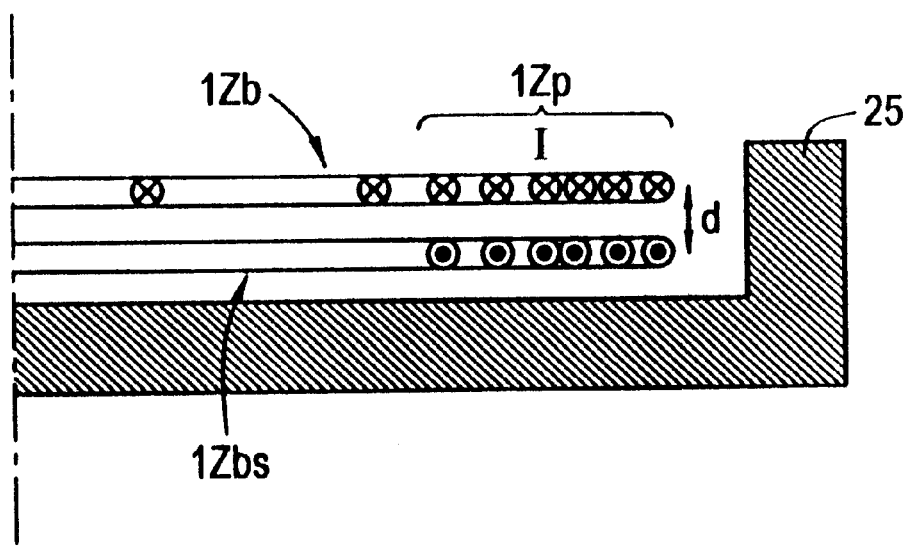
FIG. 9 illustrates the position of windings obtained from the electric current density distribution.

In Step S2, the position of windings of the partially shielding coil is determined, as shown in FIG. 9, based on the magnitude of the electric current which the partially shielding coil can carry, and the electric current density distribution obtained at Step S1.

It should be noted that the method of determining the position of windings based on an electric current density distribution is disclosed in, for example, Japanese Patent Application Laid Open No. 6-14900.

Figure 10:
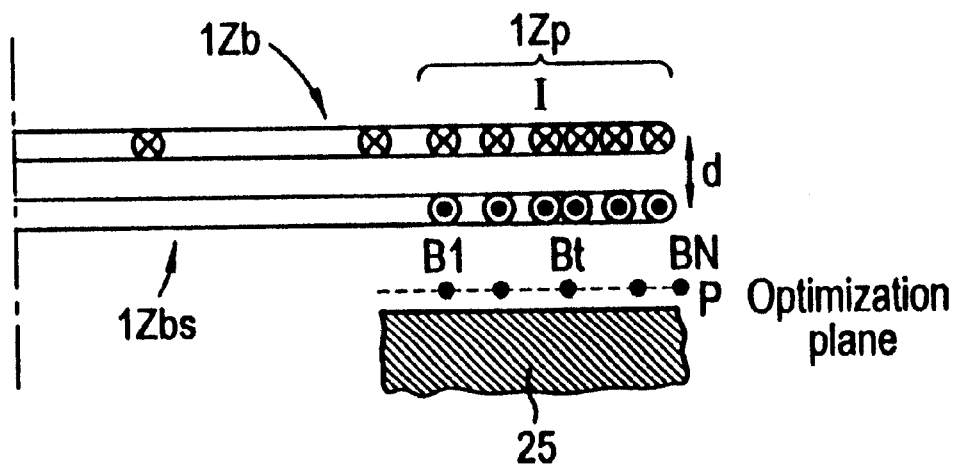
FIG. 10 illustrates the step of optimizing the position of the windings.
Figure 11:
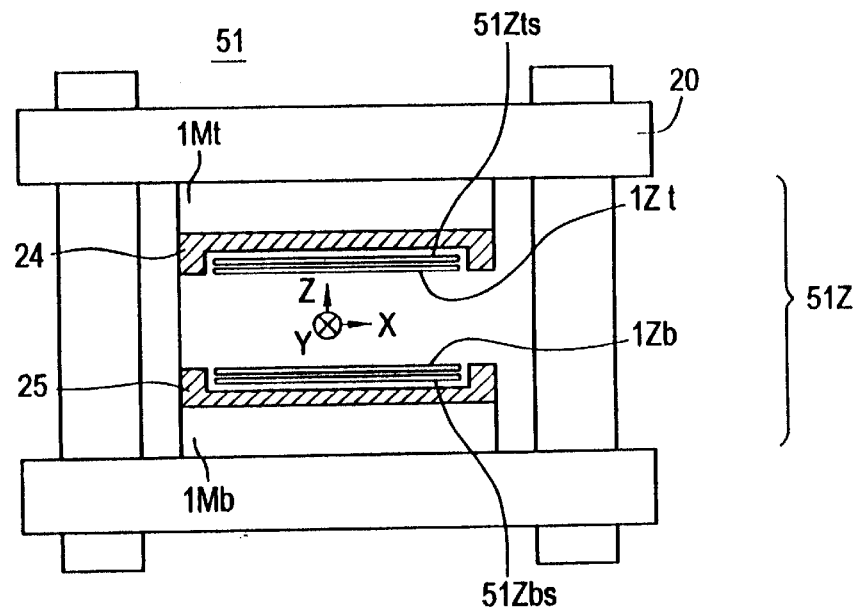
FIG. 11 is a schematic view showing the main portion of a conventional magnet assembly.
Figure 12:
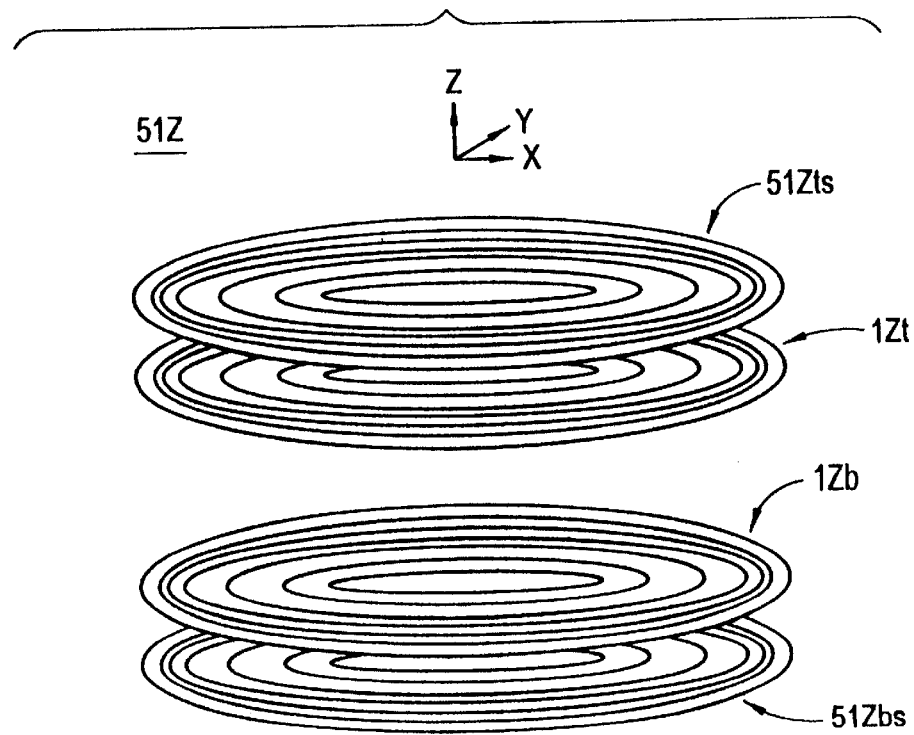
FIG. 12 is a schematic perspective view of a conventional Z-axis gradient coil.

In Step S3, as shown in FIG. 10, an optimization plane P is defined between the partially shielding coil and a magnetic component lying near the partially shielding coil, and the position of the windings of the partially shielding coil is optimized by a least squares technique so that the sum of square of the magnetic field Bt (t=1, . . . , N) at a plurality of evaluation points in the optimization plane P is minimized. Thus, the optimum position of the windings can be determined for the Z-axis partially shielding coil 1Zts and 1Zbs as shown in FIG. 4.

It should be noted that the optimization plane P is defined at a position about 1 mm apart from the magnetic component, for example. Moreover, while a sufficiently large number of evaluation points may be defined at regular intervals, it is preferred that a minimum number of evaluation points be defined in a density distribution such that the magnetic field distribution can be appropriately sampled in the optimization plane P, in order to reduce a load to the calculation process.

According to the MRI apparatus 100 as described above, since the partially shielding coils 1Zts and 1Zbs are employed having their windings positioned corresponding only to the high winding density zone 1Zp, rather than corresponding to the entire winding area, of the main gradient coils 1Zt and 1Zb, the number of windings of the shielding coils can be reduced, thereby reducing the electric power loss and the heat release. In addition, since the shielding performance required can still be attained, magnetic flux generated by the main gradient coils 1Zt and 1Zb can be prevented from affecting the magnetic field conditioning plates 24 and 25 and the like, thereby avoiding image degradation due to an adverse effect of remanence in the magnetic field conditioning plates 24 and 25 and the like.

Many widely different embodiments of the invention may be configured without departing from the spirit and the scope of the present invention. It should be understood that the present invention is not limited to the specific embodiments described in the specification, except as defined in the appended claims.

What is claimed is:

1. In an MRI apparatus comprising:
   a magnetic structure defining a space into which a subject is placed for examination, and comprising a magnet:
      RF coil means for providing an RF signal to said magnetic structure;
      gradient coil means for providing gradient signals to said magnetic structure; and
      means for providing an image of said subject from signals received from said subject exposed to said RF signal and said gradient signals; the improvement wherein:
         said gradient coil means comprises
            at least one main gradient coil disposed in said magnetic structure adjacent said magnet; and
            at least one shielding coil disposed between said main gradient coil and said magnet whereat winding densities of said main gradient coil and said shielding coil are highest;
   and wherein:
      said magnetic structure comprises:
         a pair of yokes;
         a pair of permanent magnets attached to said yokes;
         a pair of magnetic field conditioning plates disposed on opposite faces of said pair of permanent magnets; and
      wherein said at least one main gradient coil comprises a pair of main gradient coils disposed on opposite surfaces of said magnetic field conditioning plates.

2. The apparatus of claim 1, wherein
said at least one shielding coil comprises:
   a pair of shielding coils disposed respectively between said main gradient coil and said surface of said magnetic field conditioning plate; and wherein
      said pair of main gradient coils are each circular in shape; and wherein
         said pair of shielding coils are each circular in shape; and wherein
            said pair of shielding coils cause magnetic flux density to be suppressed on said surface of said magnetic field conditioning plate.

3. The apparatus of claim 1, wherein said at least one shielding coil comprises a pair of shielding coils disposed respectively between said main gradient coil and said magnetic field conditioning plate.

4. The apparatus of claim 1, wherein said pair of main gradient coils are each circular in shape.

5. The apparatus of claim 3, wherein said pair of shielding coils are each circular in shape.

6. The apparatus of claim 3, wherein said pair of shielding coils cause magnetic flux density to be suppressed on a surface of said magnetic field conditioning plate.

7. The apparatus of claim 1, wherein said magnet comprises a superconductor magnet.

8. The apparatus of claim 1, wherein said gradient coil means is driven based on a pulse sequence using a spin echo process.

9. A gradient coil for an MRI apparatus comprising:
   a partially shielding coil interposed between a main gradient coil and a magnetic conditioning plate, wherein
      said partially shielding coil has its winding positioned only in a high winding density zone containing a portion in which a winding density of said main gradient coil is highest, whereby
         magnetic flux from said main gradient coil is prevented from affecting said magnetic conditioning plate.

10. In an MRI apparatus comprising:
   a magnetic structure defining a space into which a subject is placed for examination, and comprising a magnet and a conditioning plate;
   RF coil means for providing an RF signal to said magnetic structure;
   gradient coil means for providing gradient signals to said magnetic structure; and
   means for providing an image of said subject from signals received from said subject exposed to said RF signal and said gradient signals; the improvement wherein:
      said gradient coil means comprises:
         at least one main gradient coil disposed in said magnetic structure adjacent said magnet; and
         at least one shielding coil disposed between said main gradient coil and said magnet whereat winding densities of said main gradient coil and said shielding coil are highest so that magnetic flux generated by said main gradient coil does not affect said conditioning plate.

11. The apparatus of claim 10, wherein said magnet comprises a superconductor magnet.

12. The apparatus of claim 10, wherein said gradient coil means is driven based on a pulse sequence using a spin echo process.

* * * * *